United States Patent
Rozman et al.

(10) Patent No.: US 9,291,683 B2
(45) Date of Patent: Mar. 22, 2016

(54) POWER MODULE PROTECTION AT START-UP

(71) Applicants: Subarna Pal, Wylie, TX (US); Stephen C. Guthrie, Allen, TX (US)

(72) Inventors: Allen F. Rozman, Garland, TX (US); Subarna Pal, Wylie, TX (US); Stephen C. Guthrie, Allen, TX (US)

(73) Assignee: General Electric Company, Schenectady, NY (US)

( * ) Notice: Subject to any disclaimer, the term of this patent is extended or adjusted under 35 U.S.C. 154(b) by 206 days.

(21) Appl. No.: 13/649,743

(22) Filed: Oct. 11, 2012

(65) Prior Publication Data

US 2013/0088894 A1    Apr. 11, 2013

Related U.S. Application Data

(60) Provisional application No. 61/545,964, filed on Oct. 11, 2011.

(51) Int. Cl.
| | |
|---|---|
| *H02M 3/22* | (2006.01) |
| *G01R 31/40* | (2014.01) |
| *H02M 1/32* | (2007.01) |
| *H02M 1/36* | (2007.01) |
| *H02M 3/335* | (2006.01) |

(52) U.S. Cl.
CPC .............. *G01R 31/40* (2013.01); *H02M 1/32* (2013.01); *H02M 1/36* (2013.01); *H02M 3/33592* (2013.01); *Y02B 70/1475* (2013.01)

(58) Field of Classification Search
CPC .......... G01R 31/40; H02M 1/32; H02M 1/36; H02M 3/33592; Y02B 70/1475

USPC ........................................................... 361/18
See application file for complete search history.

(56) References Cited

U.S. PATENT DOCUMENTS

| | | | | |
|---|---|---|---|---|
| 3,818,306 | A | | 6/1974 | Marini |
| 4,403,213 | A | * | 9/1983 | Khamare et al. ............. 340/517 |
| 4,611,154 | A | * | 9/1986 | Lambropoulos et al. ..... 318/490 |
| 4,931,742 | A | * | 6/1990 | Karash et al. ................ 324/541 |
| 5,262,932 | A | * | 11/1993 | Stanley et al. .................. 363/26 |
| 6,031,743 | A | * | 2/2000 | Carpenter et al. .............. 363/65 |
| 6,288,912 | B1 | | 9/2001 | Bedouet |
| 6,597,552 | B1 | * | 7/2003 | Griepentrog et al. ........... 361/62 |
| 7,554,827 | B2 | | 6/2009 | Wang |
| 7,746,668 | B2 | | 6/2010 | Weinert et al. |
| 8,154,887 | B2 | | 4/2012 | Hinds et al. |
| 2009/0237007 | A1 | * | 9/2009 | Leng ............................. 315/297 |
| 2010/0277095 | A1 | | 11/2010 | Loef et al. |
| 2011/0204803 | A1 | * | 8/2011 | Grotkowski et al. ......... 315/194 |
| 2011/0292696 | A1 | * | 12/2011 | Xiao et al. ....................... 363/37 |
| 2012/0299740 | A1 | * | 11/2012 | Ernest et al. .................. 340/649 |
| 2013/0093345 | A1 | | 4/2013 | Grotkowski et al. |

* cited by examiner

*Primary Examiner* — Thienvu Tran
*Assistant Examiner* — Kevin J Comber
(74) *Attorney, Agent, or Firm* — General Electric Company

(57) ABSTRACT

A power conversion unit includes a power converter and a controller coupled to the secondary or output stage of the power converter. The power conversion unit is configured to generate an output test voltage or current during a pre-start test period of the power converter, where the output test voltage or current is monitored to determine a converter fault condition. A method of operating a power conversion unit is also included.

19 Claims, 5 Drawing Sheets

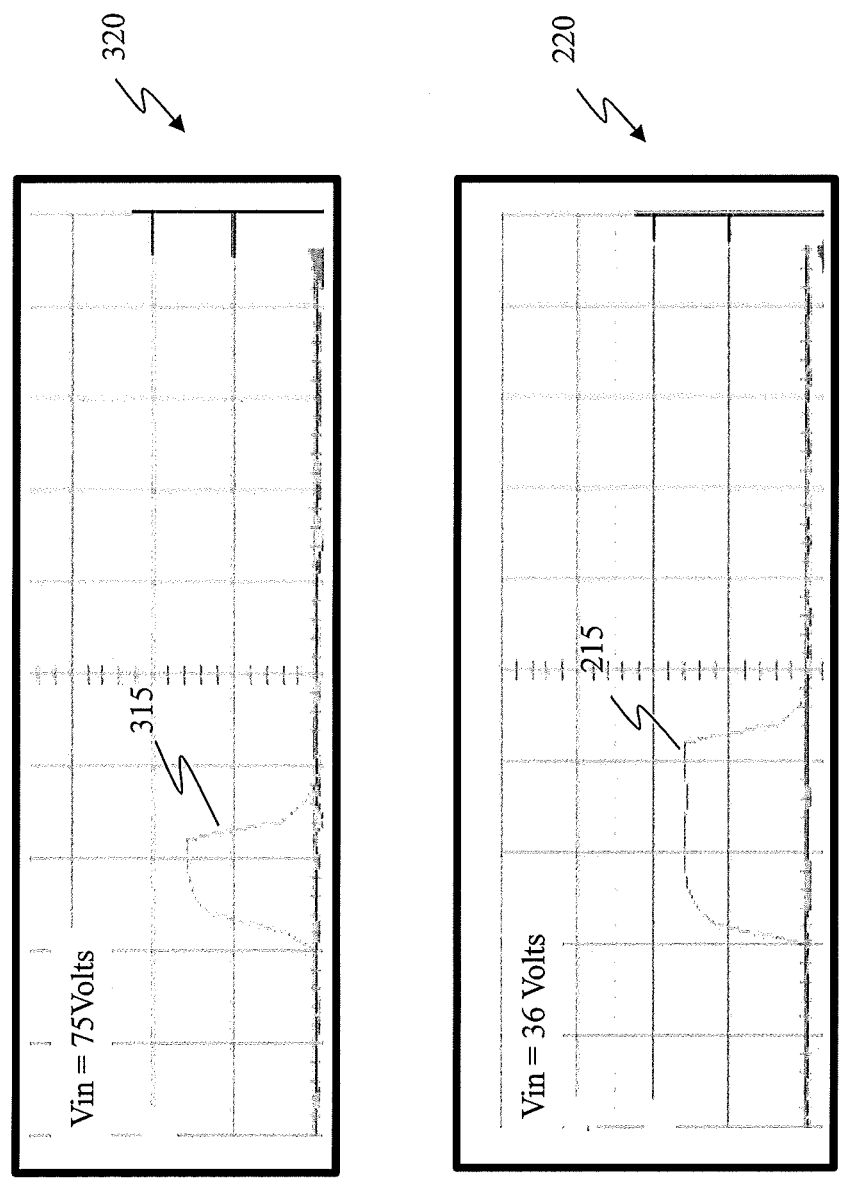

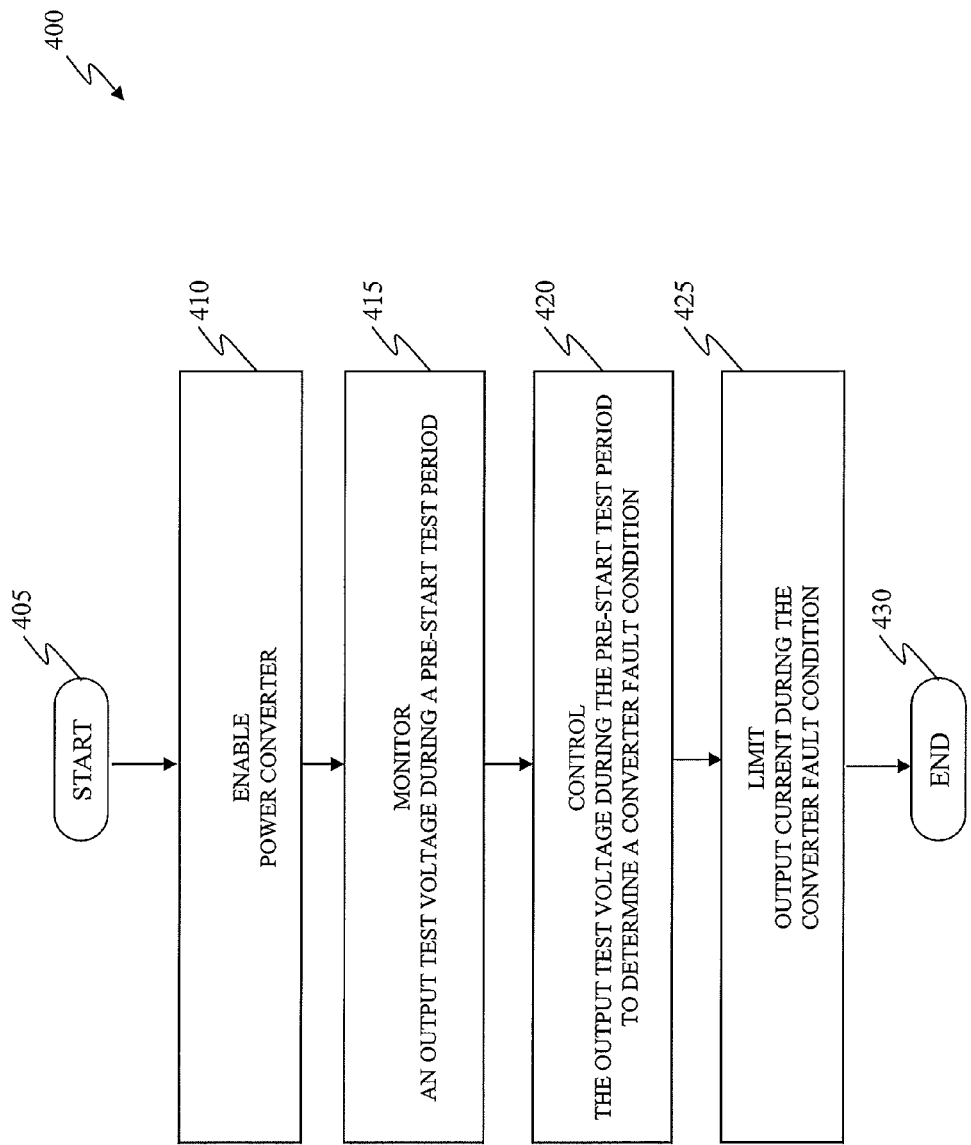

ue to an isolation barrier 118 comprising transformers, inductors, or capacitors, etc. Isolation barrier 118 separates

POWER MODULE PROTECTION AT START-UP

CROSS-REFERENCE TO RELATED APPLICATION

This application claims the benefit of U.S. Provisional Application Ser. No. 61/545,964, filed by Allen Rozman, Subarna Pal and Stephen Guthrie on Oct. 11, 2011, entitled "Power Module Protection at Start-up" commonly assigned with this application and incorporated herein by reference.

TECHNICAL FIELD

This application is directed, in general, to power conversion and, more specifically, to a power conversion unit and a method of safeguarding a power conversion unit such as during startup or re-startup.

BACKGROUND

Many conventional power modules can power up into various load conditions that may potentially cause damage to the unit if correct protective actions are not taken. DC-DC power converters, designed with synchronous rectifier output field effect transistors (FETs), have primary and secondary sides that are electrically isolated from each other by a transformer so that ground structures on the primary side and on the secondary side are also isolated from one another. The transformer may cause the ground voltage on the primary side to shift relative to the ground voltage on the secondary side. Further, the two ground voltages may not track each other; additionally, the transformer causes a time delay in the propagation of signals from the primary to the secondary side. There may even be a fault or short circuit condition on one side of the transformer without the other side being aware of the condition for quite a while. As such, if the primary side has a power supply (e.g. having a pulse-width-modulated circuit (PWM)) that is ramped up or turned on, an overcurrent situation may occur and damage the secondary side, the PWM and any peripheral circuitry. Consequently, it would be beneficial to have methods and circuits to protect the power supply from this scenario, preferably with solutions that are cost-effective, small, easily implemented, flexible, and readily extendible to other power supply configurations.

SUMMARY

Embodiments of the present disclosure provide a power conversion unit and methods of operating the power conversion unit.

In one embodiment, the power conversion unit includes a power converter having primary and secondary (or input and output) stages. Additionally, the power conversion unit includes a voltage controller coupled to the secondary stage and configured to determine a converter fault condition.

In another aspect, a method of operating a power conversion unit includes enabling a power converter and monitoring an output test voltage to determine a converter fault condition of the power converter.

Additional embodiments and details are described in the following sections.

BRIEF DESCRIPTION OF EXEMPLARY DRAWINGS

Reference is now made to the following descriptions taken in conjunction with the accompanying drawings, in which:

FIGS. 2A and 2B illustrate a collection of exemplary output waveforms showing a power conversion unit power up sequence based on one input voltage such as 36V;

FIGS. 3A and 3B illustrate another collection of exemplary waveforms showing a power conversion unit power up sequence based on another input voltage such as 75V; and FIG. 4 illustrates a flow diagram of an embodiment of a method of operating a power conversion unit carried out according to the principles of the present disclosure.

DETAILED DESCRIPTION

This application describes embodiments of a DC-DC power conversion unit and methods to detect various possible fault conditions using information from the secondary or output side of the conversion unit. The information is monitored during certain periods of a startup or re-startup of the power conversion unit. In one embodiment, DC-DC power conversion units, designed with synchronous rectifier output field effect transistors (FETs) or other power switch technology, have primary and secondary sides that are electrically isolated from each other so that the ground structures on the primary side and on the secondary side are separated. Examples of power modules used in the present disclosure employ a secondary or output side control architecture that does not have access to the primary side information, either through a primary side current transformer or an equivalent device. Therefore, some embodiments of the present disclosure provide power module protection based on the secondary or on the output side measurements. In alternative embodiments, these methods and circuits are applied to non-isolated DC-DC conversion units and also to isolated AC-DC conversion units.

In order to protect a power module, a power converter is driven with a fixed low duty cycle PWM signal to provide an output voltage at a low level for a specific amount of time so that the output of the power module can be analyzed for fault conditions before the normal soft start power-up process is begun. This duty cycle is adjusted based on various parameters such as input voltage, temperature or pre-defined load characteristics in order to provide a consistent output voltage.

Surge current into an output capacitor or an overload condition can be controlled during this period and compared against an expected surge threshold that protects both the power module and a customer's system. For example, a short circuit condition is detected by sensing an output voltage below the expected voltage produced by the fixed duty cycle PWM prior to an over-current condition being detected. Alternatively, the approach is tuned for detecting an impedance short (e.g., a crack in a ceramic output capacitor due to a thermal event).

Figure 1:
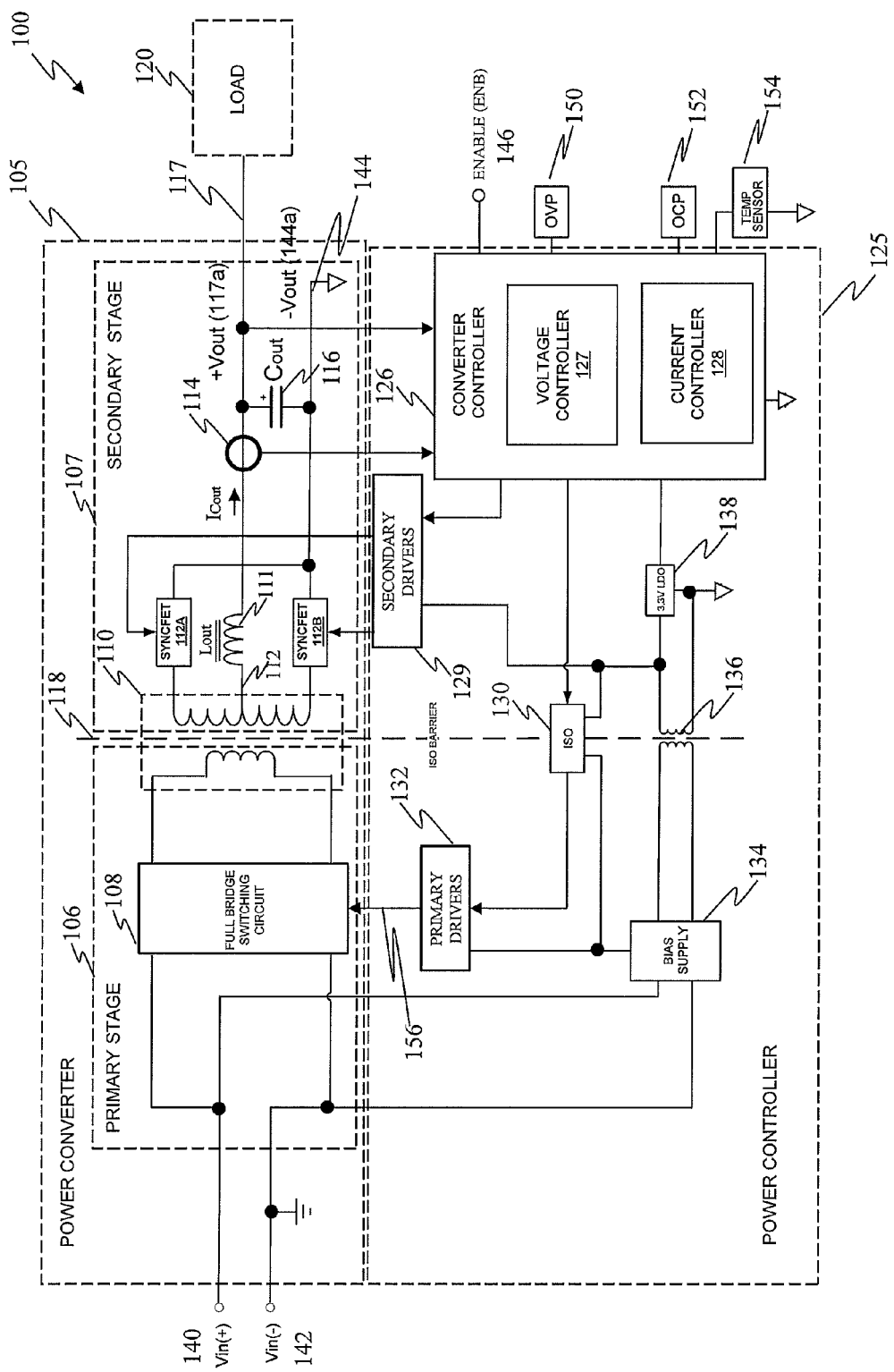
FIG. 1 illustrates a block diagram of an embodiment of a DC-DC power conversion unit, which employs a control system.

FIG. 1 illustrates a block diagram of a DC-DC power conversion unit, generally designated 100, which employs a secondary control architecture constructed according to the principles of the present disclosure. The power conversion unit 100 includes a power converter 105 and a power controller 125. The power converter 105 includes power processing components (e.g. part of the controller 126) and sensing components (e.g. current sensor 114) and drive circuitry (e.g. primary drivers 132) of the power conversion unit 100. Power converter 105 has primary and secondary stages 106, 107 that are isolated from each other, such as by galvanic isolation, due to an isolation barrier 118 comprising transformers, inductors, or capacitors, etc. Isolation barrier 118 separates the ground structures, the primary ground structure 142 and the secondary ground structure 144. Isolation barrier 118 also separates the input and output power supply voltages Vin+ 140 and Vout+ 117*a* on either side of the isolation barrier 118. The power controller 125 also employs the isolation barrier 118 to electrically isolate the primary and secondary stage components (e.g. bridge switching circuit 108 or capacitor 116) that are referenced to the separate ground structures 142 and 144. In other embodiments, the isolation barrier 118 comprises optical isolators such as optocouplers.

The power converter 105 has a pulse width modulator (PWM) that is connected to convert a DC input voltage Vin+ 140 to a DC output voltage Vout+ 117*a* across a load 120. The power converter 105 includes a PWM such as a full bridge switching circuit 108, a main power transformer 110, an output inductor 111, first and second synchronous output rectifier switches (e.g., FETs) 112A, 112B, a secondary stage output current sensing unit 114 and an output filter capacitor Cout 116. In one embodiment, the output filter capacitor Cout 116 includes an output filter capacitor contained within the power converter 105. Alternatively, Cout 116 is placed outside of the power converter 105. An external filter capacitor or capacitance is connected across the extended wires or nodes associated with Vout− 144*a* and Vout+ 117*a*. The main power transformer 110 forms part of the isolation barrier 118. In addition, the power transformer 110 and an output inductor 111 are combined into an integrated magnetic structure. Instead of a full bridge switching circuit, other embodiments include various power conversion topologies such as a half-bridge circuit, resonant, forward, buck, boost, flyback and any combination of these or derivative circuit topologies.

The power controller 125 includes a converter controller 126 having a voltage controller 127 and a current controller 128. Voltage controller 127 includes processing circuitry to detect and monitor voltages. Similarly, the current controller 128 includes processing circuitry to detect and monitor current. The power controller 125 also includes secondary switch drivers 129 to operate output rectifier switches (e.g., FETs) 112A, 112B; an isolation device 130; primary switch drivers 132 to control and operate the full bridge switching circuit 108; and a bias supply unit 134 that is connected through a bias supply transformer 136 to a secondary side DC bias voltage regulator 138. The isolation device 130 and the bias supply transformer 136 also form part of the isolation barrier 118. Examples of isolation devices 130 include capacitors, optocouplers, open switches, transformers, etc.

In one exemplary operation, a DC input voltage Vin+ 140 is provided to the power conversion unit 100. The full bridge switching circuit 108 provides a full wave AC signal to primary windings of the main power transformer 110. The secondary windings of the main power transformer 110 then provide a full wave AC secondary signal for rectification to the first and second synchronous rectifier output switches 112A, 112B. A rectified output signal is provided from a secondary winding center tap 112 of the main power transformer 110 to an output filter including the output inductor 111 and the output filter capacitor 116. The output current sensing unit 114 provides an indication of a secondary stage output current magnitude for the secondary stage 107.

The power controller 125 provides operating control of the power converter 105 causing the converter 105 to deliver output voltage and output current to the load 120, based on established set-points and feedback information from a converter output Vout+ 117*a*. Generally, the converter controller 126 establishes control signals (e.g., pulse width modulation (PWM) signals) that are provided through the primary and secondary switch drivers 132, 129 to control conduction times of the primary and secondary stages. Alternatively, depending upon the power unit topology, the converter 126 varies the operating frequency to control the converter output Vout+ 117*a*. The isolation device 130 provides electrical isolation for primary control signals, as noted above. The bias supply unit 134, bias supply transformer 136 and DC bias voltage regulator 138 provide secondary supply power that is independent of the operating status of the power converter 105.

In other embodiments, the power conversion unit 100 illustrated in FIG. 1 may have other features and components that are not shown. For example, the power conversion unit 100 may also have a digital communication input/output (I/O) node to converter controller 126 to provide data to the power conversion unit 100 or to receive inputs for programming or customizing the operation or manufacturing process. Alternatively, the customizing includes changing the nature of a pre-start period, such as to vary the duty cycle or duration of the pre-start period, to adjust a specific loading condition or to compensate for environmental aspects such as temperature.

Figure 2A:
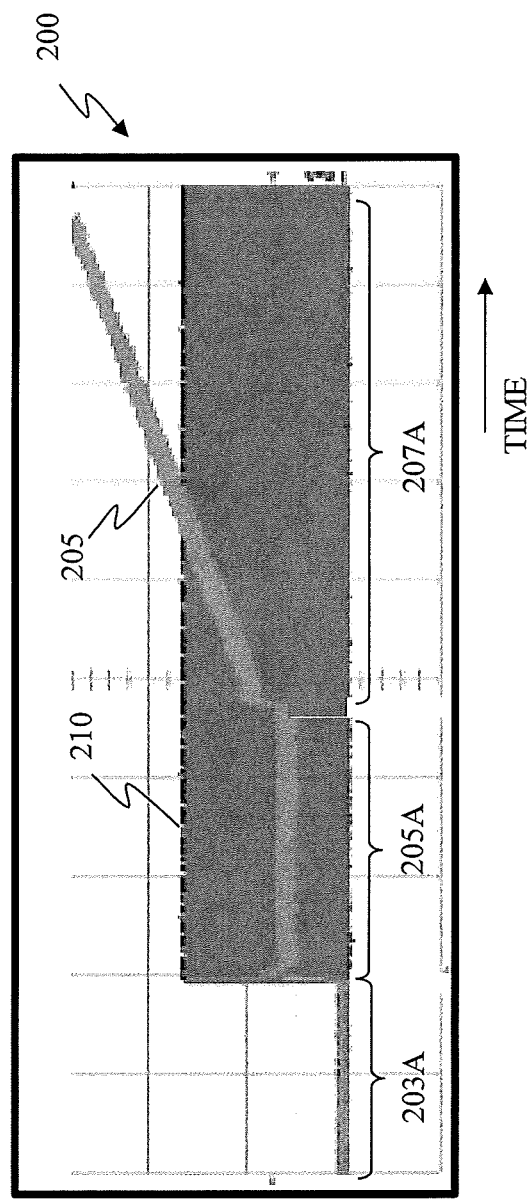

In one embodiment, powering up the converter 105 comprises an ENABLE period (e.g. 203A in FIG. 2A), the pre-start test period (e.g. 205A in FIG. 2A), a soft start or ramp period (e.g. 207A in FIG. 2A). Then after ramping or powering up, the converter 105 operates in a normal or stable run mode. During the ENABLE period, the power conversion unit 100 has only a limited number of circuits turned on. For example, the converter controller 126 is powered up (ON) to detect whether there are any unusual voltages Vout+ 117*a*, such as a spike voltage or high frequency fluctuations. But the other circuits such as the full bridge switching circuit 108 |remain|$_{|GE1|}$ powered off. Then the converter controller 126 guides the power converter 105 through the pre-start test period that ensures proper power conversion system turn-on fault conditions are met. During the pre-start test period, the full bridge switching circuit 108 is turned on by the converter controller 126 so that it causes a non-zero voltage Vout+ 117*a* to occur. Vout+ 117*a* comprises small or narrow-width pulses and/or then larger-width pulses as a duty cycle of the full bridge switching circuit 108 is adjusted by the voltage controller 127. Accordingly, the voltage controller 127, which is coupled to the output voltage Vout+ 117*a* of the secondary side 107, is configured to provide an output test voltage during the pre-start test period. The output test voltage is monitored by the converter controller 126 to determine if the power converter 105 has a fault condition. Additionally, the current controller 128 is coupled to the secondary stage output current sensing unit 114 and is configured to limit a secondary stage output current $I_{Cout}$ for the pre-start test period under certain conditions, such as an overcurrent condition due to a fault or excessive output surge current.

These overcurrent conditions may occur under any capacitance value affecting the converter output Vout+ 117*a* as well as the load 120. Regardless of the capacitance value or load 120, the pre-start test conditions include determining that there are no general fault conditions present (e.g., over-temperature or improper input voltage conditions) and that an external ENB 146 command and input voltage Vin+ 140 are present. The ENB 146 command is an externally-generated enable signal that turns on the converter controller 126 during a startup or re-startup sequence for the power converter 105. If ENB 146 continues to be TRUE, then the converter controller 126 remains on. A duration of the pre-start test period is fixed or, alternatively, programmed for specific load conditions. As another alternative, the pre-start test period is adjusted from unit to unit to accommodate variations in unit timing and other parameters.

In one embodiment and during the pre-start test period, a fixed low duty cycle control signal at node 156 is provided by the primary driver 132 that results in a small test value of the output voltage Vout+ 117a. The small test value is maintained for a fixed or programmed period, while the output voltage Vout+ 117a is monitored and checked for fault conditions. If the output voltage Vout+ 117a is determined to be beyond (e.g. less than or greater than) a pre-determined expected value (e.g., a short condition) or the secondary stage output current sensing unit 114 indicates that the secondary stage output current $I_{Cout}$ is greater than an allowable test current (e.g., the short condition or a surge current that is too large), a fault condition is determined and the power converter 105 is prevented from starting up. A maximum overcurrent protection OCP 152 at a surge current level having a minimum delay time is provided during this pre-start test period.

Alternatively, if no fault condition is determined at the end of the pre-start test period, a soft start period is initiated, thus allowing the power converter 105 to ramp-up to its normal set-point output voltage. During this ramp time, some protections are placed on the power converter 105. For example, a medium overcurrent protection level having a short delay time is provided, along with a maximum overcurrent protection for any surge currents having a minimum delay time. During a normal operating period (i.e., at the end of the soft start period), normal overcurrent protection having a longer delay time is provided along with the maximum overcurrent protection for a surge current level employing the minimum delay time.

FIGS. 2A and 2B illustrate an exemplary collection of waveforms 200 and 220, respectively, showing a power conversion unit 100 during a start or re-start sequence for an input voltage Vin+ 140 of 36 volts. In FIG. 2A, the horizontal axis represents a time and the vertical axis, a voltage. The waveforms 200 include a converter output test voltage Vout 205, a primary (PWM) control signal 210, and an ENABLE period 203A, a pre-start test period 205A, and a soft start or ramp period 207a of the converter output test voltage Vout 205. During an ENABLE period 203A, the value of Vout 205 is substantially zero or approximately the same as Vout− 144a. During the pre-start test period 205A, in this particular operational example, the value of Vout 205 is substantially constant and at an expected value (a constant value above the value zero or at Vout− 144a), indicating that there is no fault condition. Since during the pre-start test period 205A, the behavior of Vout 205 is relatively calm and uneventful, subsequently, the power converter 105 is permitted to continue its operation and converter 105 ramps up during a soft start period 207a and Vout 205 reflects a ramp curve.

In the example of FIG. 2A, the primary PWM control signal 210 includes a low-duty cycle signal having narrow-width pulses with an amplitude of approximately 1-2 volts. The horizontal axis spans a large time period so that it is difficult to see the individual pulses of the primary PWM control signal 210. FIG. 2B depicts one individual pulse 215 of the primary PWM control signal 210. That is, in FIG. 2B, the waveform 220 includes a magnified primary PWM control signal portion 215 of the primary PWM control signal 210 of FIG. 2A. Thus, the time span of the horizontal axis in FIG. 2B is much shorter than the time span depicted in FIG. 2A so that it is possible to see an individual pulse of the primary PWM control signal 210.

During the pre-start test period 205a, a duty cycle of the primary PWM control signal 210 is low as compared to the duty cycle of signal 210 when the full bridge switching circuit 108 is allowed to ramp up during the ramp period 207a. During the pre-start test period 205a, the choice of duty cycle is selected such that the converter output test voltage Vout 205 is expected to be about 0.6-0.8 Volts if there are no fault conditions or other problems.

The primary PWM control signal 210 at node 156 is generated by the primary drivers 132 in response to control signals from the converter controller 126 to control or operate the full bridge switching circuit 108.

As an example of possible voltage values for one exemplary choice of setup and time periods, a power conversion unit (e.g., the power conversion unit 100) responds to an ENB 146 signal to enable the power controller 125 and the converter controller 126 during the ENABLE period 203A, 205A and 207A and during normal operation. During the pre-start test period 205A, the power converter 105 is also powered on; the pre-start test period 205A, which is greater than 0.5-1.5 millisecond. If there are no fault conditions during the pre-start test period 205A, the converter output test voltage Vout 205 remains at about 0.7-0.8 V. In this example, if at the end of the pre-start test period, it is determined that there are no fault conditions, then the power converter 105 enters a soft-start mode and the output test voltage Vout 205 yields a ramped voltage. The power converter 105 continues to its set-point value or its stable operational value if no fault conditions develop. These aforementioned particular values may vary under other operational conditions, such as in a heated environment, or vary due to manufacturing differences for a particular product.

Figure 3A:
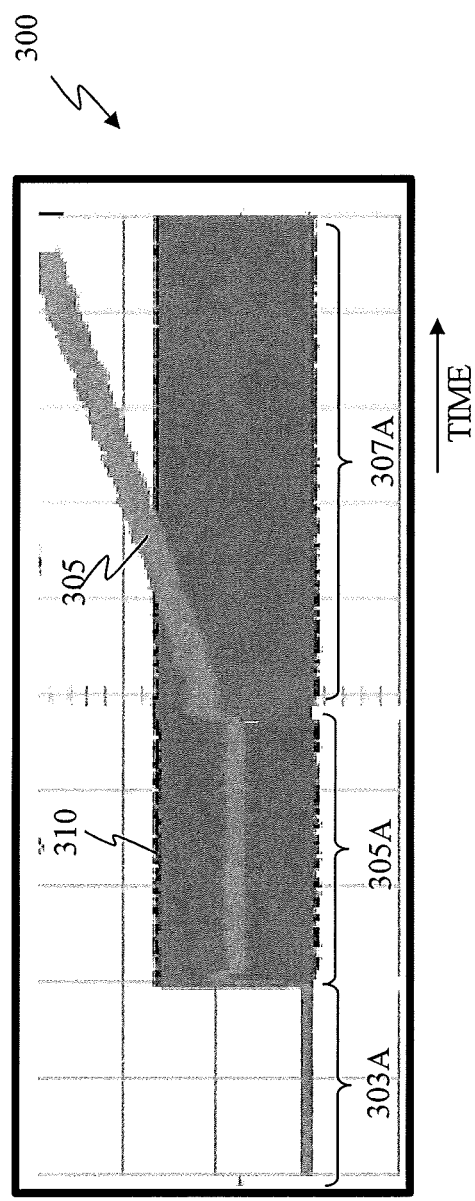

FIGS. 3A and 3B illustrate another collection of waveforms 300 and 320, respectively, showing a power conversion unit pre-start sequence for an input voltage Vin+ 140 of 75 Volts. The waveforms 300 include a converter output voltage Vout 305, a primary (PWM) control signal 310 and a pre-start test period 305A of the converter output voltage Vout 305, as before. In FIG. 3B, the waveform 320 includes a magnified primary control signal portion 315 of the primary PWM control signal 310 depicted in FIG. 2B. That is, the magnified primary control signal portion 315 depicts one individual pulse of the primary PWM control signal 310.

In the illustrated example of FIG. 3A, a power conversion unit responds to an ENB 146 signal and subsequently enters the pre-start test period 305A that is greater than one millisecond. When there are no faults, the converter output test voltage Vout 305 yields a fairly constant, expected voltage during the pre-start test period 305A. In this example, if it is determined that there are no fault conditions, and the power converter 105 enters a soft-start mode where it is again ramped to its set-point value if no fault conditions develop.

A comparison of FIGS. 2B and 3B shows that the pre-selected width of the magnified primary PWM control signal portion 215 is correlated with the magnitude of the input voltage Vin+ 140. The width of the magnified primary control signal portion 315 is about half the width of the magnified primary control signal portion 215, since the input voltage Vin+ 140 of 75 volts is about twice the input voltage of 36 volts. These amplitudes and duration of the pre-start test period and input voltage levels identified in this example illustrates a specific case. In other embodiments, different current or voltage thresholds and test period durations, fixed or programmable, are implemented for other types of power conversion modules or different situations for the same power conversion module.

FIG. 4 illustrates a flow diagram of an embodiment of a method of operating a power conversion unit, generally designated 400. The method 400 starts in a block 405, and power converter 105 with primary and secondary stages having a galvanic isolation barrier between the primary and secondary stages, or a non-isolation power converter are provided in procedure 410. During the ENABLE period, the converter controller 126 is operational and detects the output voltage (e.g. Vout+ 117a) of the secondary stage 107. Other circuits, such as the full bridge switching circuit 108 or some other type of pulse-width-modulated PWM power circuit, are in an OFF state so that the full bridge switching circuit (PWM) 108 should produce a low (e.g. 0 volts) and substantially constant voltage Vout+ 117a as expected. When Vout+ 117a is the expected value, this is indicative of a normal startup and operation. If there are no overvoltages or current spikes or other problematic voltages or currents produced, the converter controller 126 (or the ENB 146) enables the full bridge switching circuit 108 (PWM 108) during the pre-start test period.

In more detail, the PWM 108 operates as a power generator producing narrow or wider pulses depending on the duty cycle of the pulses (at node 156, the output of primary drivers 132) with which the controller 126 is driving the PWM 108. Since the PWM 108 is now operational, the secondary stage 107 that is electromagnetically coupled to the PWM 108, also starts to produce an output voltage. When the output voltage is producing low duty cycle pulses or pulses of different frequencies, such pulses are integrated or averaged by the capacitor 116 and output load 120 to generate a constant voltage value that is correlated or proportional to the duty cycle and amplitude of the pulses driving the PWM 108. Then, the output test voltage Vout+ 117a is monitored during the pre-start test period, in a block 415, to determine any converter fault conditions in a block 420 by comparing Vout+ 117a (or its associated value in LOAD 120) with an expected value that is a predetermined threshold value. For example, the converter controller 126 checks whether Vout+ 117a is beyond (greater than or less than) the particular threshold value. Also, different threshold values are a preselected or predetermined and associated with different fault conditions. Alternatively, one threshold value is selected and set for any or a group of fault conditions.

The converter controller 126 controls or causes an output test voltage by operating the PWM 108, and then controller 126 monitors the output test voltage for fault conditions. A secondary stage output current is limited if there is a converter fault condition, in a block 425, so that the circuits would not be damaged. Alternatively, instead of limiting the output current, a portion (e.g. the full bridge switching circuit 108) of the power converter 105 is disabled.

In one embodiment, the output test voltage Vout+ 117a corresponds to a low duty cycle pulse width modulated (PWM) signal having a low voltage amplitude depending on the magnitude of the output capacitance and load at node 117, which is monitored. In another embodiment, the output test voltage corresponds to a variable frequency signal that is monitored. In yet another embodiment, the converter fault condition corresponds to an output capacitor fault, an output load fault, a temperature fault, or a current fault. In still another embodiment, the converter fault condition corresponds to an improper temperature condition detected in one or more sensors associated with the power converter.

In a further embodiment, the secondary stage power converter output current is an initial surge current. In a yet further embodiment, the secondary stage power converter output current corresponds to an output capacitor fault. Accordingly, the output capacitor fault corresponds to an output capacitor impedance short. In a still further embodiment, the secondary stage power converter output current corresponds to an output load fault. That is, although the foregoing embodiments focused on voltages and the voltage controller 127 part of the converter controller 126 circuit, it is possible to apply current controller 128, instead. Alternatively, a combination of current and voltage is applied to operate the power converter 105. The method 400 ends in a block 430.

While the method disclosed herein has been described and shown with reference to particular blocks performed in a particular order, it will be understood that these blocks may be combined, subdivided, or reordered to form an equivalent method without departing from the teachings of the present disclosure. For example, instead of implementing the exemplary embodiments during startup, the converter 105 enters a sleep mode and the exemplary methods are implemented as part of the wake up mode, or the exemplary methods are implemented as part of a disaster recovery mode. Further, unless specifically indicated herein, the order or the particular grouping of the blocks is not a limitation of the present disclosure. In addition, other combinations or partitions of the circuits and elements are also possible. For example, in another embodiment, the converter 105 is implemented with additional stages or with an intermediate stage so that there are primary, secondary and tertiary stages.

Those skilled in the art to which this application relates will appreciate that other and further additions, deletions, substitutions, modifications or combinations may be made to the described embodiments. For example, although Vin– 142 is set to ground (or zero volts), another voltage value is also possible, or that the output voltage Vout– is also referenced to a non-zero value.

What is claimed is:

1. A power conversion unit comprising:
    a power converter having a primary stage and a secondary stage, the primary stage including a pulse width modulated (PWM) circuit;
    an isolation barrier separating the primary stage from the secondary stage such that primary stage information is unavailable to the secondary stage; and
    a voltage controller located in the secondary stage and configured to test the power converter and a load coupled to the power converter for a fault condition by driving the PWM circuit to produce an output test voltage at the secondary stage during a pre-start test period of the power converter; wherein the output test voltage beyond a predetermined threshold value is indicative of a fault condition.

2. The power conversion unit as recited in claim 1 wherein the output test voltage corresponds to one of a low duty cycle PWM signal and a variable frequency signal.

3. The power conversion unit as recited in claim 1 wherein the pre-start test period corresponds to one selected from the group consisting of:
    a fixed length of time;
    a variable length of time;
    a fixed amplitude voltage during the pre-start test period; and
    a variable amplitude voltage during the pre-start test period.

4. The power conversion unit as recited in claim 1 wherein the fault condition corresponds to one selected from the group consisting of:
    an output capacitor fault;
    an output load fault;
    a temperature fault; and
    a current fault.

5. The power conversion unit as recited in claim 1, wherein the voltage controller is in an ON state during an ENABLE period, and the power converter is in an OFF state during the ENABLE period; and wherein the ENABLE period precedes the pre-start test period.

6. The power conversion unit as recited in claim 1 further comprising a current controller coupled to the secondary stage and operative to limit a secondary stage output current during the pre-start test period.

7. The power conversion unit as recited in claim 6 wherein the secondary stage output current is an initial surge current.

8. The power conversion unit as recited in claim 6 wherein the secondary stage output current corresponds to one of an output capacitor fault and an output load fault.

9. A method of operating a power conversion unit having a power converter with primary and secondary stages, the method comprising:
   isolating the primary stage from the secondary stage using an isolation barrier such that primary stage information is unavailable to the secondary stage;
   testing the power converter and a load coupled to the power converter for a fault condition by monitoring an output test voltage using a voltage controller at the secondary stage during a pre-start test period;
   controlling a PWM circuit in the power converter to yield the output test voltage during the pre-start test period; and
   determining a fault condition of the power converter based on the output test voltage.

10. The method of claim 9 wherein isolating the primary stage from the secondary stage further comprises isolating the primary stage from the secondary stage with a galvanic isolator.

11. The method as recited in claim 9 wherein the output test voltage corresponds to a low duty cycle PWM signal.

12. The method as recited in claim 9 wherein the fault condition corresponds to one selected from the group consisting of:
   an output capacitor fault;
   an output load fault;
   a temperature fault; and
   a current fault.

13. The method as recited in claim 9 further comprising operating a controller during an ENABLE period; and monitoring an output of the secondary stage with the controller while the power converter is in an OFF state.

14. The method as recited in claim 9 further comprising limiting a secondary stage output current during the fault condition.

15. The method as recited in claim 9 wherein the secondary stage output current is an initial surge current.

16. The method as recited in claim 14 wherein a surge in the secondary stage output current corresponds to one of an output capacitor fault and an output load fault.

17. The method as recited in claim 12 wherein the output capacitor fault corresponds to an output capacitor impedance short.

18. A power conversion unit comprising:
   a power converter having an input stage and an output stage;
   an isolation barrier separating the input stage from the output stage such that input stage information is unavailable to the output stage;
   a controller located in the output stage and driving the power converter; and
   the power converter operative to test the power converter and a load coupled to the power converter for a fault condition by producing an output test current at the output stage during a pre-start test period, wherein a value of the output test current is indicative of a fault condition.

19. The power conversion unit as recited in claim 18 wherein the isolation barrier further comprises a galvanic isolation between the input stage and the output stage.

* * * * *